United States Patent
Soltermann et al.

[11] Patent Number: 5,971,904
[45] Date of Patent: Oct. 26, 1999

[54] MACHINE-TOOL PROVIDED WITH A SINGLE HIGH STORAGE CAPACITY TOOL MAGAZINE, AND TOOL MAGAZINE INTENDED TO BE FITTED TO A MACHINE-TOOL

[75] Inventors: Claude Soltermann, Nidau; Werner Imhof, Bienne; Alexandre Faoro, La Neueville, all of Switzerland

[73] Assignee: Posalux S.A., Bienne, Switzerland

[21] Appl. No.: 09/035,095

[22] Filed: Mar. 5, 1998

[30] Foreign Application Priority Data

Mar. 11, 1997 [EP] European Pat. Off. ............. 97104024

[51] Int. Cl.⁶ ..................................................... B23Q 3/157
[52] U.S. Cl. .................................. 483/68; 483/58; 483/66
[58] Field of Search ................................. 483/62, 63, 65, 483/66, 68, 64, 61

[56] References Cited

U.S. PATENT DOCUMENTS

| | | | |
|---|---|---|---|
| 3,355,797 | 12/1967 | Lohned | 483/66 |
| 3,715,801 | 2/1973 | Sato et al. | 483/66 X |
| 4,590,662 | 5/1986 | Norota | 483/64 |
| 4,920,631 | 5/1990 | Novak | 483/61 |
| 5,407,416 | 4/1995 | Ottone et al. | 483/66 X |
| 5,478,300 | 12/1995 | McMurthy et al. | 483/64 X |
| 5,542,899 | 8/1996 | Yamada et al. | 483/51 X |
| 5,613,930 | 3/1997 | Chrisman et al. | 483/63 X |

FOREIGN PATENT DOCUMENTS

| | | |
|---|---|---|
| 0 541 020 | 5/1993 | European Pat. Off. . |
| 0 555 576 | 8/1993 | European Pat. Off. . |
| 216 667 A1 | 12/1984 | Germany . |
| 3424178 | 4/1985 | Germany ................. 483/68 |
| 35 39 662 A1 | 5/1987 | Germany . |
| 3613206 | 10/1987 | Germany ................. 483/68 |
| 89 15 599 | 11/1990 | Germany . |
| 90 10 220 | 11/1991 | Germany . |
| 24934 | 2/1984 | Japan ....................... 483/68 |
| 284346 | 12/1986 | Japan ....................... 483/68 |
| 237832 | 10/1988 | Japan ....................... 483/66 |
| 1177124 | 9/1985 | U.S.S.R. .................. 483/68 |
| 2 128 903 | 10/1984 | United Kingdom . |

*Primary Examiner*—William Briggs
*Attorney, Agent, or Firm*—Griffin, Butler, Whisenhunt & Szipl, LLP

[57] ABSTRACT

The present invention concerns a machine-tool (20) including at least one machining station able to accommodate selectively a tool, at least one tool magazine for storing the tools, a tool transfer device, and control means for driving the tool magazine. The machine-tool is characterised in that the tool magazine (21) is formed as a closed circuit of several interconnected main supports (30), in that each main support (30) can accommodate and hold several subsidiary supports (31) intended to carry at least two tools. The machine-tool (20) further includes an operator interface for loading/unloading the subsidiary supports (31) from outside the machine-tool (20), independently of the operating state of the machine-tool (20). The storage capacity of such a tool magazine (21) is advantageously high, and makes the machine-tool highly autonomous.

24 Claims, 8 Drawing Sheets

MACHINE-TOOL PROVIDED WITH A SINGLE HIGH STORAGE CAPACITY TOOL MAGAZINE, AND TOOL MAGAZINE INTENDED TO BE FITTED TO A MACHINE-TOOL

The present invention concerns a machine-tool provided with a least one machining station intended to perform machining operations upon workpieces, in particular upon printed circuit boards, by using cutting tools and, more particularly, a machine-tool provided with at least one machining station and a single tool storage magazine having a high storage capacity.

The present invention also concerns a tool magazine intended to be fitted to such a machine-tool.

Machine-tools provided with at least one machining station are conventionally used for performing drilling, shaping and milling operations automatically on workpieces, in particular printed circuit boards.

British Patent Application No 2 128 909 in the name of the Applicant of the present invention discloses a machine-tool provided with at least one machining station, capable of machining boards of any dimensions.

Figure 1:
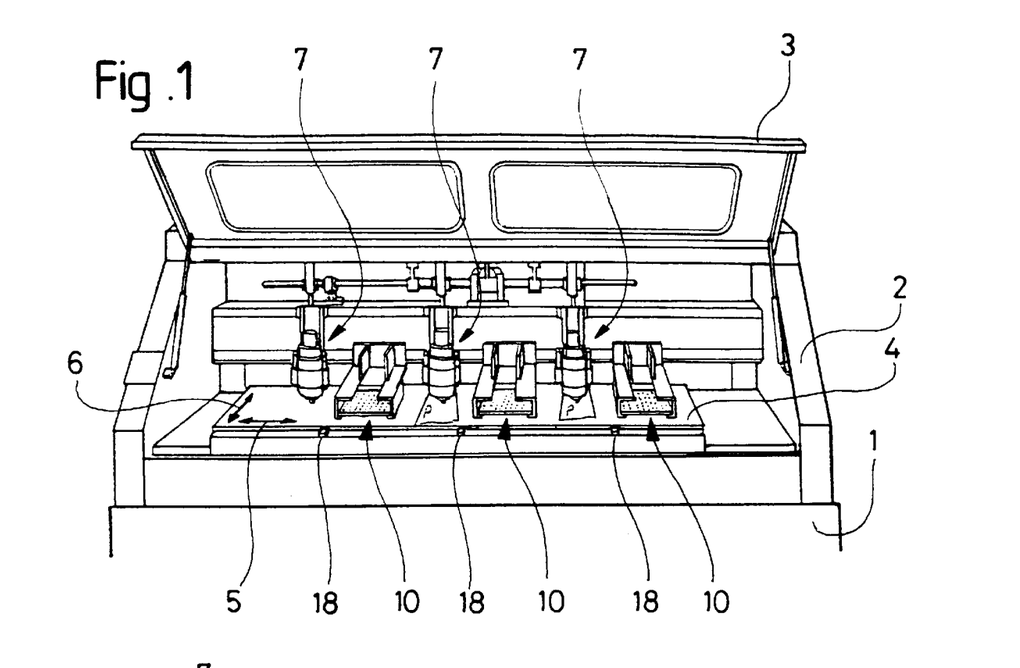
FIG. 1 shows a general view of a machine-tool according to the prior art.

FIG. 1 shows a general view of an embodiment of a machine-tool according to the prior art.

A machine-tool of this type essentially includes a frame 1, on which is mounted a casing 2 fitted with a hood 3 able to be placed in an open position, which allows access to the working area and to the various machine-tool components. The frame includes, in particular, a workpiece carrier 4 able to move in two perpendicular directions, designated by axes 5 and 6, via the action of control means (not shown) and guiding means (not shown).

Workpiece carrier 4 is fitted with fixing means (not shown) for assuring clamping of the workpieces which, in the example shown in FIG. 1, comprise printed circuit boards designated by the reference P.

This machine-tool also includes three machining stations or units 7, as is shown in FIG. 1. It goes without saying that this number of machining stations is purely illustrative.

In the aforecited Patent Document, the workpiece carrier and the guiding means are attached to the frame and the machining stations are fixed. This has the effect of allowing machining stations to move with respect to the workpiece carrier.

Moreover, the machining stations are able to move simultaneously or independently in a third direction (axis Z) perpendicular to the two other directions. The same machining pattern can thus be performed on boards P associated with each machining station.

Each machining station 7 includes a motorised spindle 13 intended to accommodate and rotatably drive a tool 12 for performing a determined machining operation. Tool 12 may be a drill, a routing cutter or any other tool able to be used for machining boards P.

Figure 2:
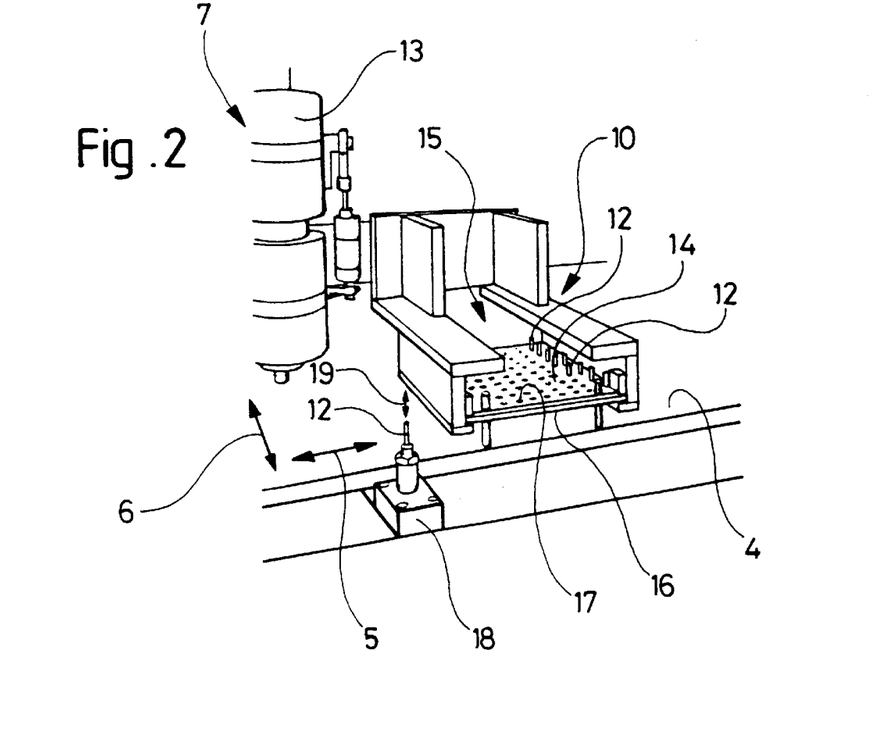
FIG. 2 shows a machine-tool of FIG. 1 in more detail.

A plurality of tools is available in one or more storage sites or magazines, designated by the reference 10 in FIG. 1. FIG. 2 shows the tool magazine disclosed in the aforecited Patent Application in more detail. The tool magazine is associated with each machining station 7, and is formed of a removable cartridge 14 mounted so as to slide into a seat 15. Cartridge 14 includes a board 16 provided with a matrix network of holes 17, each hole 17 being intended to accommodate a tool 12.

The machine-tool further includes a transfer device 18 attached to workpiece carrier 4. The transfer device includes a changer 18 which allows a tool 12 to be loaded and unloaded in a hole 17 of cartridge 14. As is shown in more detail in FIG. 2, device 18 is attached to workpiece carrier 4, and can accommodate a tool 12. Movement of the transfer device with respect to the machining stations allows the tool 12 concerned to be unloaded from the machining station 7 concerned along a direction designated by axis 19. Via the combined action of the control means and the guiding means, replacement of the tool is thus achieved.

Such machine-tools have numerous drawbacks.

One drawback of these machine-tools lies in the fact that it is necessary to interrupt their operation in order to unload and load specific tool cartridges to perform specific machining operations, and to renew the tool cartridges as soon as the tools are worn-out. This results in a considerable loss of time during the manufacturing cycle and, consequently, a loss in the output rate of a machine-tool of this type, which is contrary to current industrial requirements and constraints. Moreover, the fact that the operator has to intervene directly in the working area of such a machine-tool during the aforementioned interventions may cause risks for said operator.

Another drawback of these machine-tools lies in the low storage capacity of tool magazines such as those described hereinbefore, which limits in particular the autonomy of these machine-tools.

An object of the present invention is to provide a machine-tool provided with at least one machining station, which overcomes the aforementioned drawbacks of the prior art.

This object, in addition to others, is achieved by a machine-tool intended to perform machining operations, in particular on printed circuit boards, including: a frame having at least one end; a workpiece carrier attached to the frame; at least one machining station able to accommodate selectively a tool for performing the machining operations in a working area; guiding means for assuring a relative movement between the machining station(s) and the workpiece carrier, at least one tool magazine for storing a plurality of tools; a tool transfer device for accommodating a tool; and control means via whose action the tool magazine is driven; characterised in that the tool magazine is formed as a closed circuit formed of a plurality of main supports connected to each other, in that each main support is capable of accommodating and holding a plurality of subsidiary supports, and in that each subsidiary support is intended to carry at least two tools.

An advantage of a machine-tool such as that defined hereinbefore is the provision a high storage capacity (typically 6,000 tools), and a high level of autonomy (typically 333 hours for a machine-tool fitted with five machining stations).

According to another advantageous feature of the present invention, the machine-tool defined hereinbefore further includes an operator interface situated at one end of the frame, and includes unloading/loading means situated in the vicinity of one part of the tool magazine.

An advantage of such a machine is the automatic or manual unloading and loading of at least one subsidiary support, so that the machine-tool continues to perform machining operations during unloading/loading of the subsidiary supports in the tool magazine.

According to another advantageous feature of the present invention, the machine-tool defined hereinbefore further includes a hood which is mobile with respect to the frame between two respective open and closed positions, the tool magazine being mobile in translation along columns between two respective positions, a first position in which the tool magazine is arranged in the vicinity of the working area and a second position in which the tool magazine is not in the vicinity of the working area, the hood being attached to the tool magazine.

An advantage of such a machine-tool lies in the fact that, in passing from its closed position to its open position, the hood drives in its path the tool magazine from its first position to its second position, and allows access to the working area by an operator.

According to other advantageous features of the present invention, the machine-tool defined hereinbefore further includes immobilising means; the immobilising means being formed by at least one clamp including two branches and immobilising elements.

An advantage of such a machine-tool is being able accurately to determine the spatial position of a subsidiary support, by removing any degree of freedom of said subsidiary support, to allow transfer of a tool between the transfer device and said subsidiary support.

Another object of the present invention is to provide a tool magazine intended to be fitted to a machine-tool, which overcomes the drawbacks of the prior art.

This object, in addition to others, is achieved by a tool magazine able to accommodate a plurality of tools, and intended to be fitted to a machine-tool, characterised in that it is formed as a closed circuit of a plurality of main supports connected to each other, in that each main support is capable of accommodating and holding a plurality of interconnected subsidiary supports, and in that each subsidiary support is intended to carry at least two tools.

The objects, features and advantages of the present invention, in addition to others, will appear more clearly upon reading the detailed description of a preferred embodiment of the invention, given solely by way of example, with reference to the annexed drawings, in which.

Figure 3:
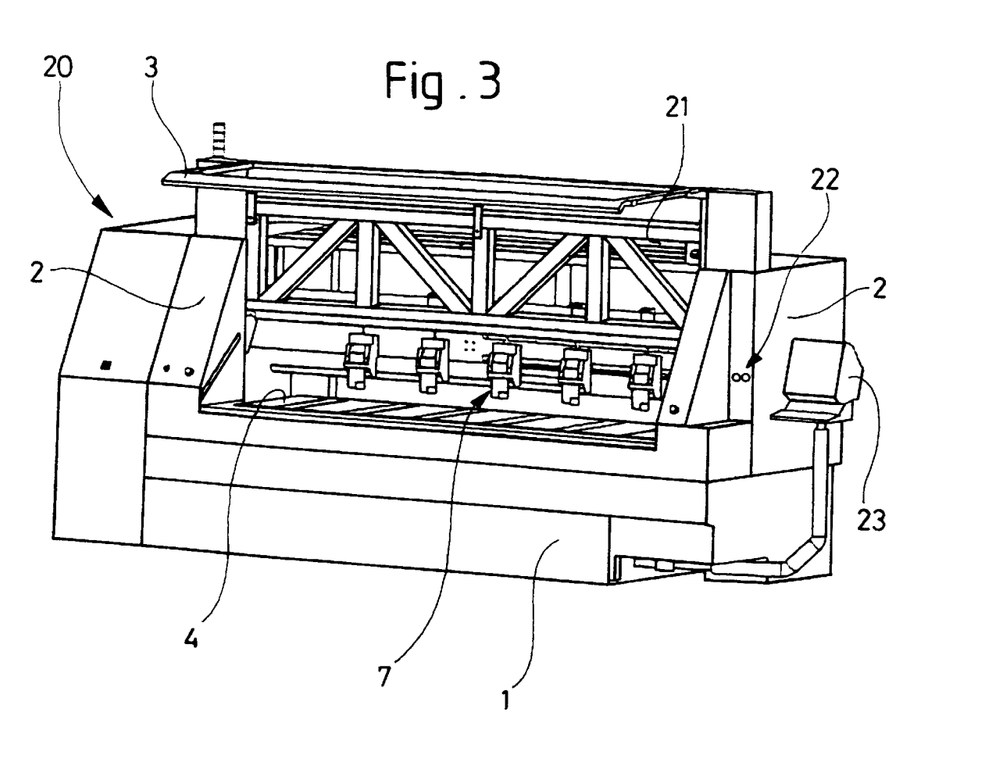
FIG. 3 shows a general view of a preferred embodiment of a machine-tool according to the present invention.

It will be noted that the structure of machine-tool 20 shown in FIG. 3 is close to the structure of the conventional machine-tool described hereinbefore. For the sake of simplicity, the components shown in FIGS. 3 to 8, and designated by the same references as those shown in FIGS. 1 and 2 are identical to those designated in FIGS. 1 and 2.

Essentially, machine-tool 20 further includes a single tool magazine 21 and an operator interface 22. Control means 23 are provided for automatically controlling various operations of machine-tool 20, in particular for controlling tool magazine 21.

Figure 4:
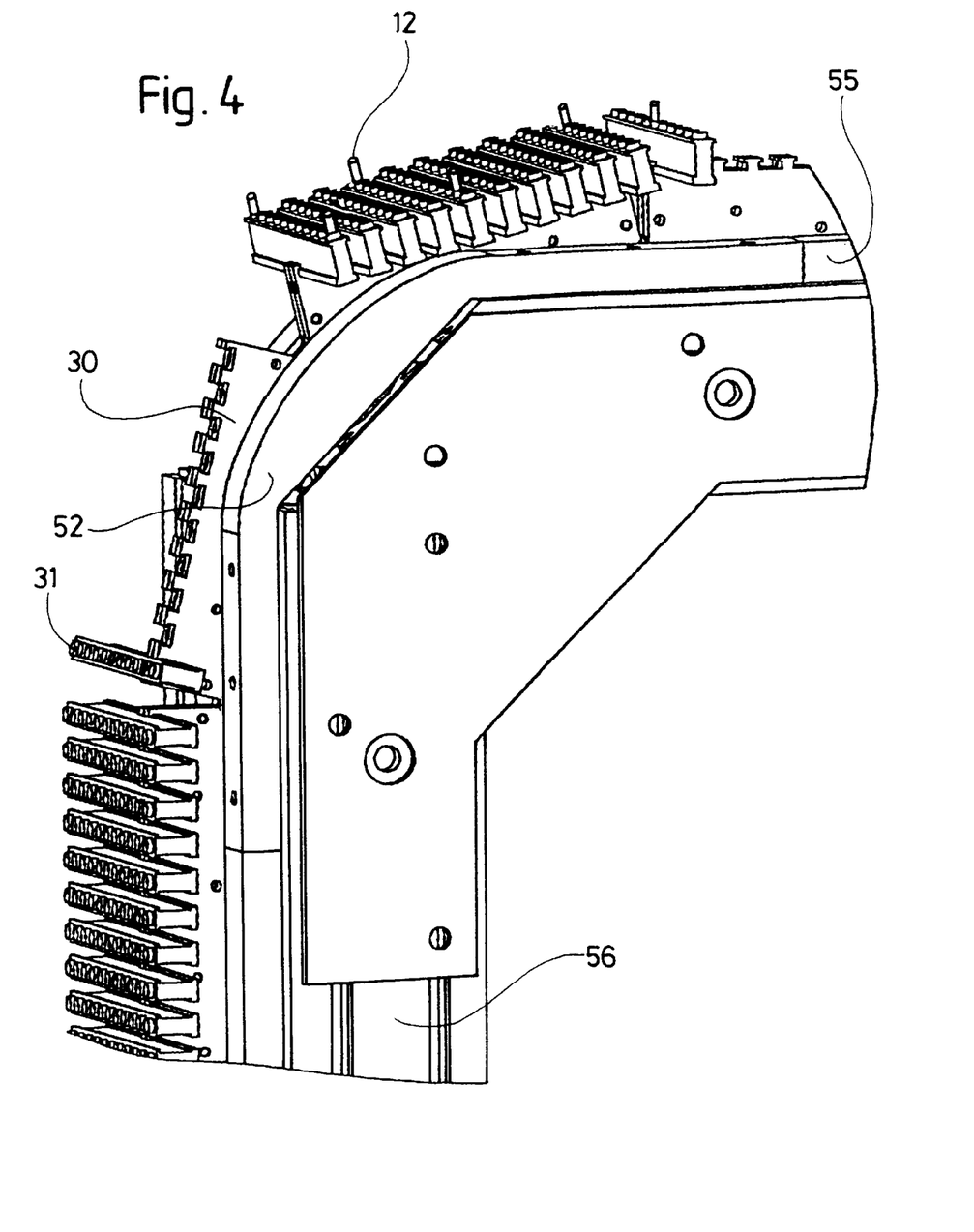
FIG. 4 shows in detail a part of the tool magazine of the machine-tool of FIG. 3.

Tool magazine 21 is formed as a closed circuit consisting of a plurality of interconnected main supports. FIG. 4 shows, in enlarged scale, a part of such a circuit. Each main support 30 is capable of accommodating and holding a plurality of subsidiary supports 31, and each subsidiary support 31 is intended to carry at least two tools 12. For the sake of clarity, FIG. 4 shows in detail a part of the tool magazine of the machine-tool of FIG. 3. It will be noted that, in the preferred embodiment which is subsequently described in more detail, the main support consists of link 30 of a chain of links (partially shown in FIG. 4), and the subsidiary support consists of a bar 31 carrying tools 12.

Reference 22 designates the unloading/loading operator interface intended to unload and load automatically or manually subsidiary supports 31, which will be hereinafter called the "operator interface". As is shown in FIG. 3, operator interface 22 is situated at one end of casing 2 of machine-tool 20, and essentially includes unloading/loading means situated in immediate proximity to a part of tool magazine 21. More precisely, these unloading/loading means include introducing means 41 for introducing subsidiary supports 31 into a main support 30 from outside machine-tool 20, and means 42 for ejecting subsidiary supports 31 towards the exterior of the machine-tool for extracting subsidiary supports 31 from a main support 30.

Figure 5:
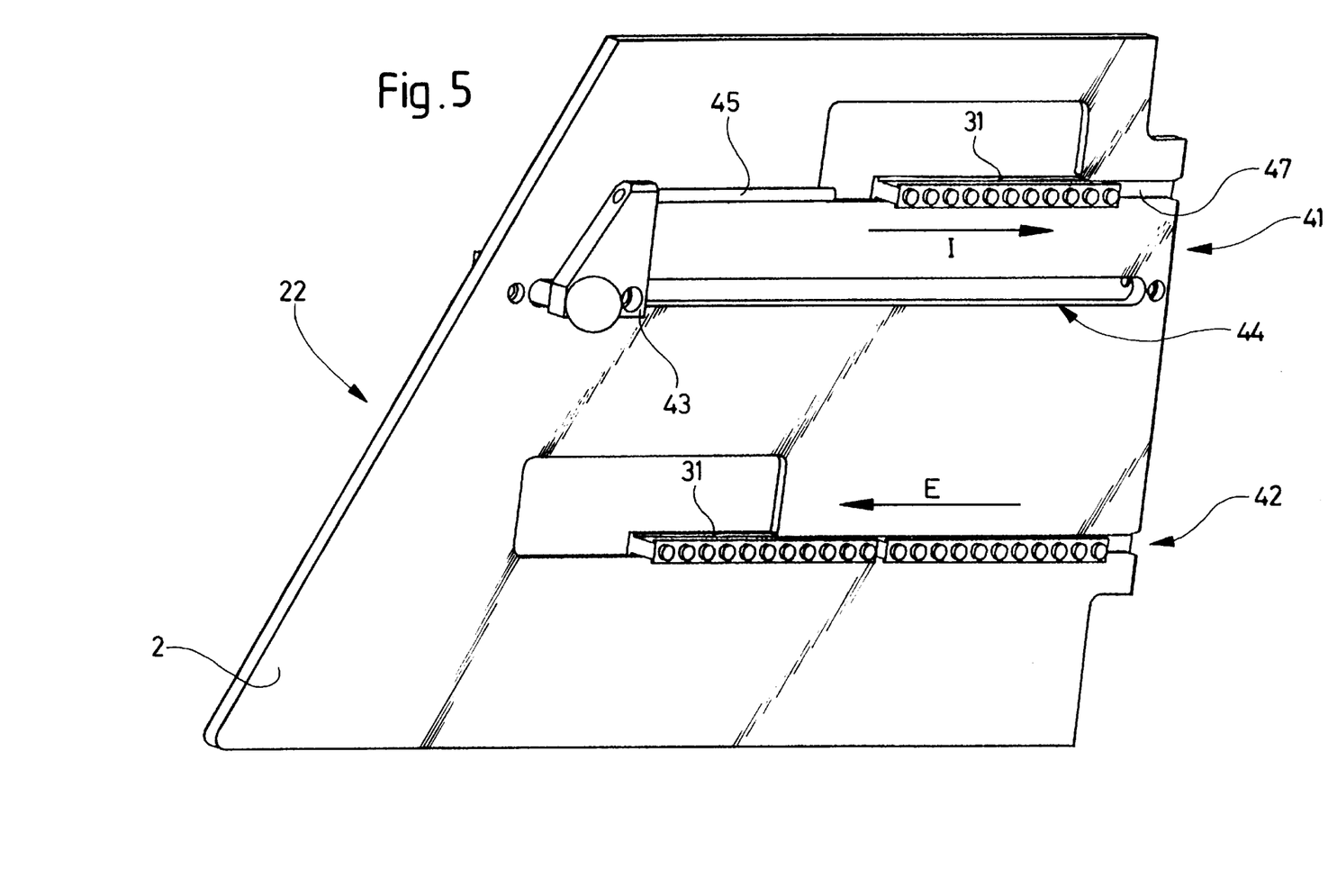
FIG. 5 shows the operator interface of the machine-tool of FIG. 3.

According to the preferred embodiment shown in FIG. 5, introducing means 41 include at least one sliding block 43 which slides into an oblong groove 44 arranged in a wall of casing 2 and capable of being actuated manually, sliding block 43 being provided with an actuation rod 45 for introducing a subsidiary support 31 into a main support. Introducing means 41 further include means for guiding the subsidiary supports formed by a groove 47 having a profiled cross section and extending parallel to oblong groove 44. Ejection means 42 include at least one jack type device (not shown).

The man skilled in the art will note that these unloading/loading means may be controlled automatically by control means 23.

Figure 6:
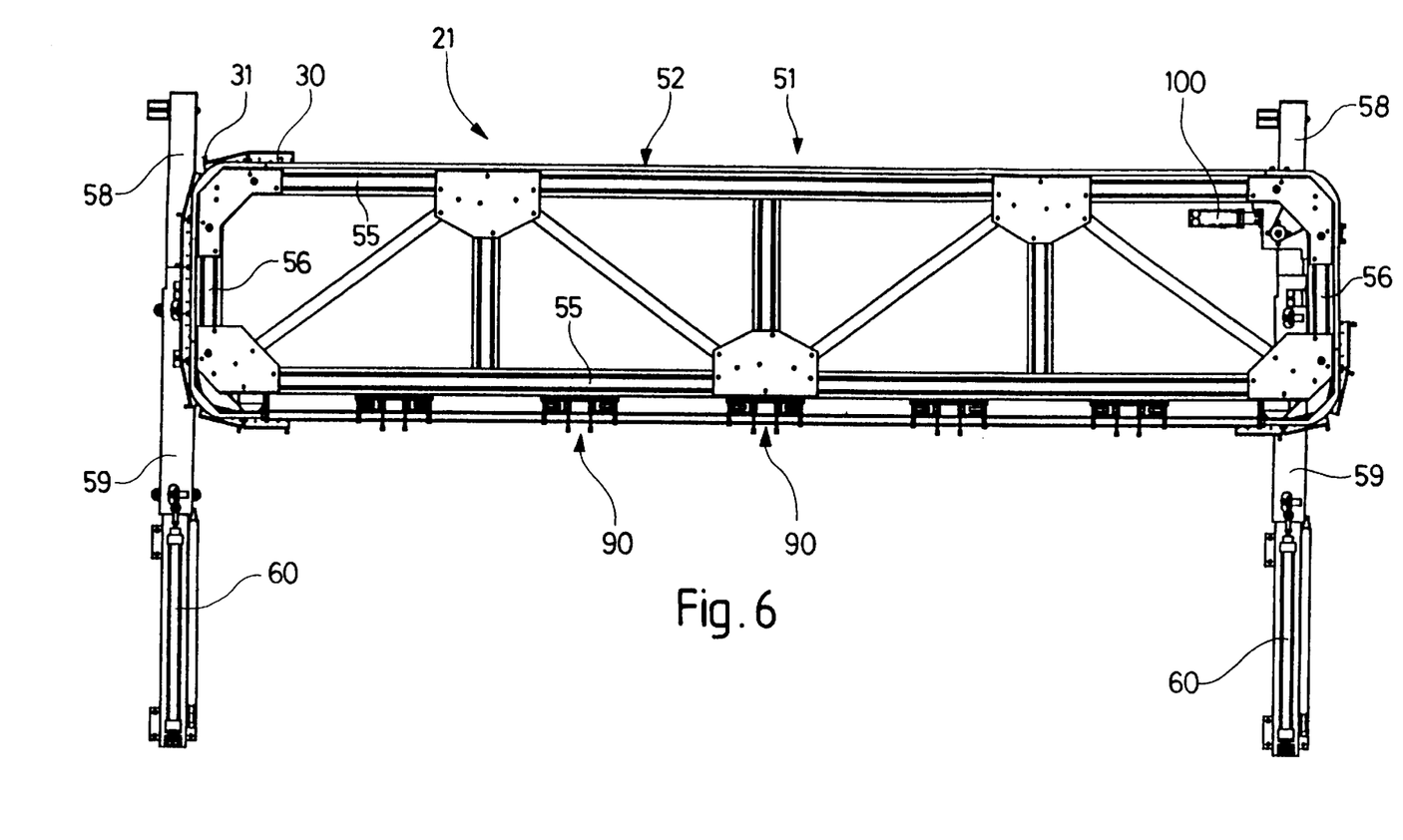
FIG. 6 shows the tool magazine of the machine-tool of FIG. 3.

FIG. 6 shows tool magazine 21 of machine-tool 20, according to the preferred embodiment of the present invention.

Tool magazine 21 is formed of a base chassis 51 for supporting main supports 30, base chassis 51 being fitted with main support guiding means 52 intended to guide main supports 30 all the way along base chassis 51. Base chassis 51 is formed by a rigid frame with four beams 55, 56, respectively two parallel cross beams 55 and two parallel vertical beams 56. Main support guiding means 52 are formed by a groove having a profiled cross-section all the way along beams 55 and 56 as is shown more clearly in FIG. 4.

Moreover, two columns 58 attached to frame 1 (not shown in FIG. 6) are connected to the two vertical beams 56. As is shown in FIG. 4, the assembly formed by base chassis 51 and columns 58 is contained in one plane. This plane is situated facing the machining station or stations, as is shown in FIG. 3.

Base chassis 51 is mobile in translation along the columns between two respective positions, a first position in which the tool magazine is disposed in the vicinity of the working area and a second position in which the tool magazine is not in the vicinity of the working area, FIGS. 3 and 6 showing base chassis 51 held in the second position. Thus, the man skilled in the art will note that said second position is the maintenance position of machine-tool 20 and that FIG. 3 does not therefore show the most common position of machine-tool 20, in its operating state.

Moreover, machine-tool 20 also includes a hood 3. Hood 3 is able to move with respect to frame 1 between two respective open and closed positions, FIG. 3 showing hood 3 in the open position.

Hood 3 is attached to base chassis 51 so that, when hood 3 passes from its closed position to its open position, hood 3 drives in its path base chassis 51 from its first position to its second position. This has the effect of allowing access to the working area by an operator.

Base chassis 51 further includes two connecting elements each formed of a sleeve 59, as is shown in FIG. 6. Each sleeve 59 is attached to a vertical beam 56, and can slide onto the corresponding column 58. Each sleeve 59 is also connected to a jack 60, whose body and rod are fixed respectively to the corresponding column 58 and the corresponding sleeve 59. This has the effect of facilitating the passage of the base chassis from the first position to the second position.

As FIG. 6 also shows, the closed circuit of tool magazine 21 is formed by a link chain (partially shown), which can be driven by motor means 100, typically a back-geared motor, in response to control signals from control means 23. In this link chain, each link constitutes a main support 30.

Figure 7:
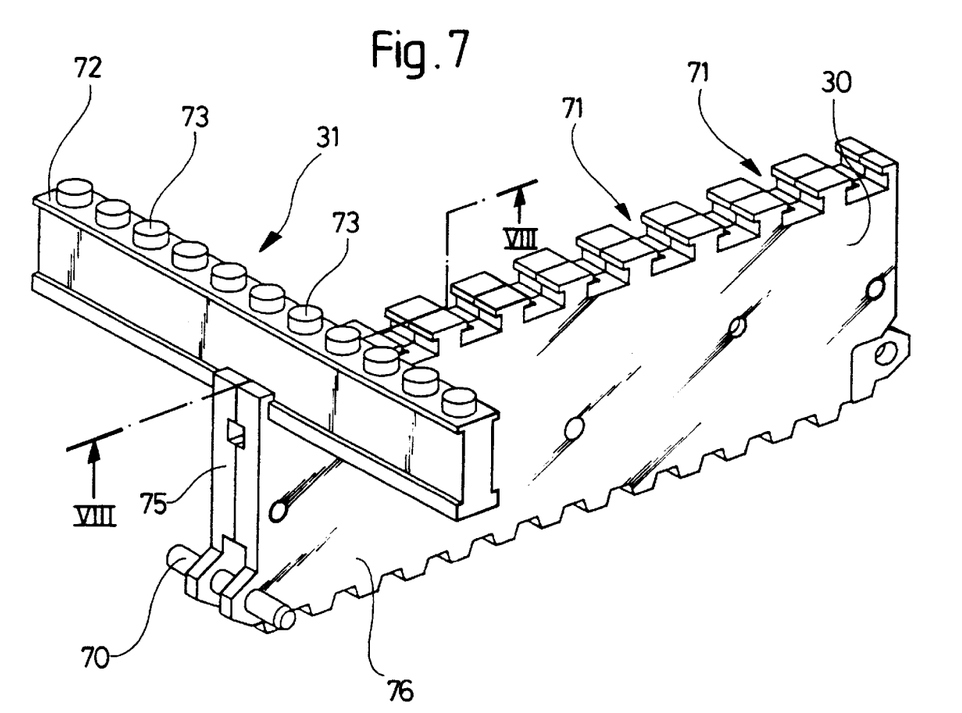
FIG. 7 shows in more detail a subsidiary support mounted on a main support of the tool magazine of FIG. 6.

FIG. 7 shows in detail a link according to the preferred embodiment.

Link 30 is formed of two identical plates 75, 76, fixed to each other.

Link 30 is hinged to each of its neighbouring links by a pin 70 which passes through the thickness of the link. The length of pin 70 is greater than the thickness of link 30, which allows pin 70 to co-operate with the groove provided in beams 55, 56 of base chassis 51, as is shown in FIG. 4.

In the example shown, link 30 is also provided with ten slide ways 71. Slide ways 71 are identical and have a common sliding direction perpendicular to the plane containing base chassis 51, as is shown in FIG. 4. It goes without saying that the number of slide ways in the example shown is purely illustrative, and may vary according to design requirements.

It will be noted in FIG. 7 that a subsidiary support 31 can be engaged by sliding into each slide way 71. According to the preferred embodiment, subsidiary support 31 is formed by a bar whose cross-section has a determined profile. A first face 72 of the bar is provided with eleven independent cylindrical conduits 73 having parallel axes to each other. Thus, each conduit 73 can accommodate a tool 12, as is shown in FIG. 4.

Figure 8:
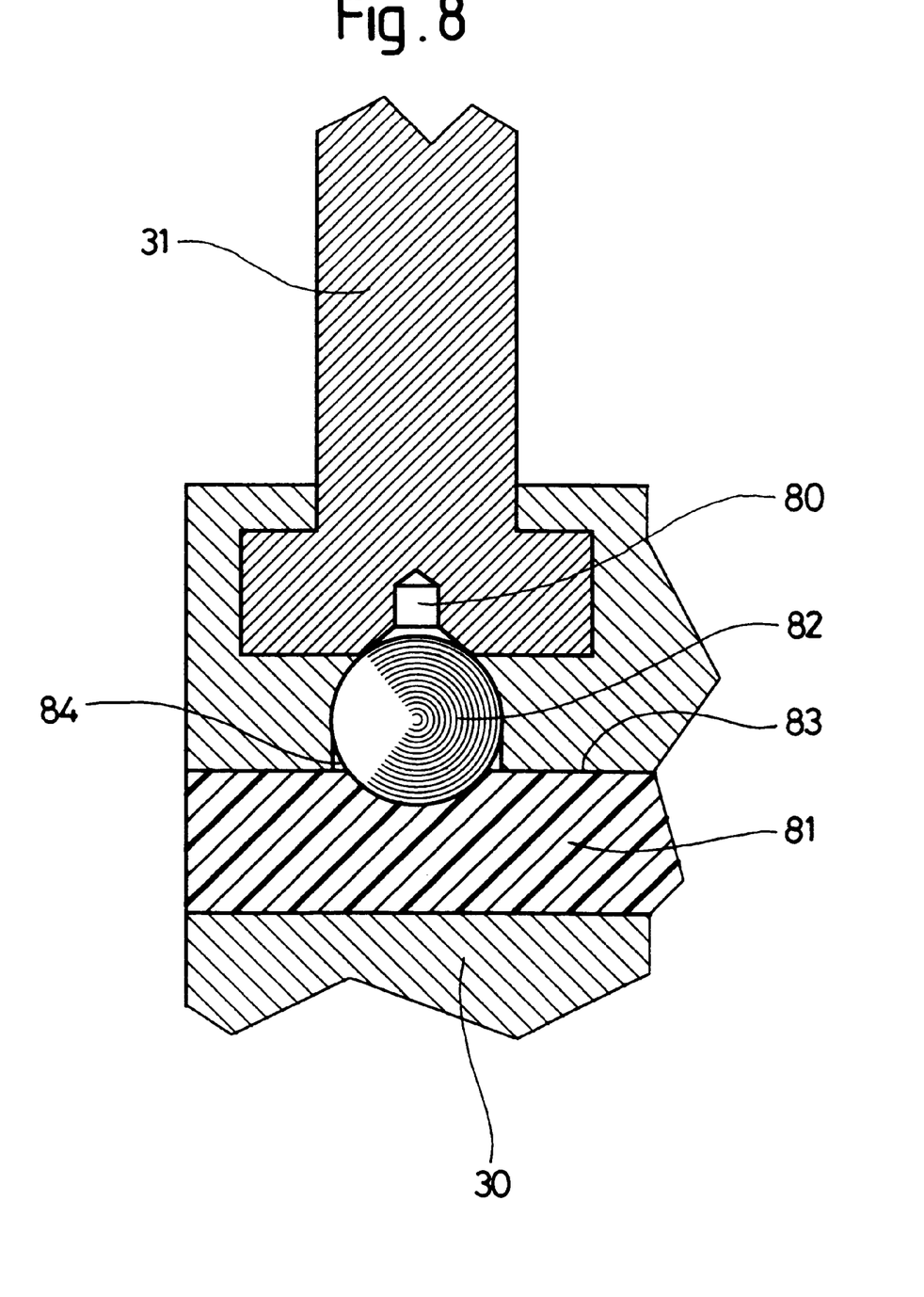
FIG. 8 is a partial cross-section along the line VIII—VIII of the subsidiary support of FIG. 7.

FIG. 8 shows a partial cross-section of a bar 31 engaged in a slide way 71 of a link 30.

The face opposite first face 73 of bar 31 includes positioning recesses 80. According to the preferred embodiment, conduits 73 are through conduits and form positioning recesses 80 via their ends opening onto the face opposite first face 72 of bar 31.

Link 30 also includes means 81, 82 for positioning bars 31 engaged in slide ways 71. Positioning recesses 81, 82 preferably include a strip made of resilient material 81 extending in a first passage 83 formed in link 30, and a plurality of balls 82 each disposed in second conduits 84 opening out, on the one hand, into the base of slide way 71 and, on the other hand, into first conduit 83. Strip 81 exerts a resilient return force onto ball 82, so that ball 82 projects into the base of the corresponding slide way 71. Ball 82 is intended to co-operate with one of the recesses 80 of bar 31 which is engaged in the corresponding slide way 71, as is shown in FIG. 8. This has the effect of holding bar 31 in a determined position.

Figure 9:
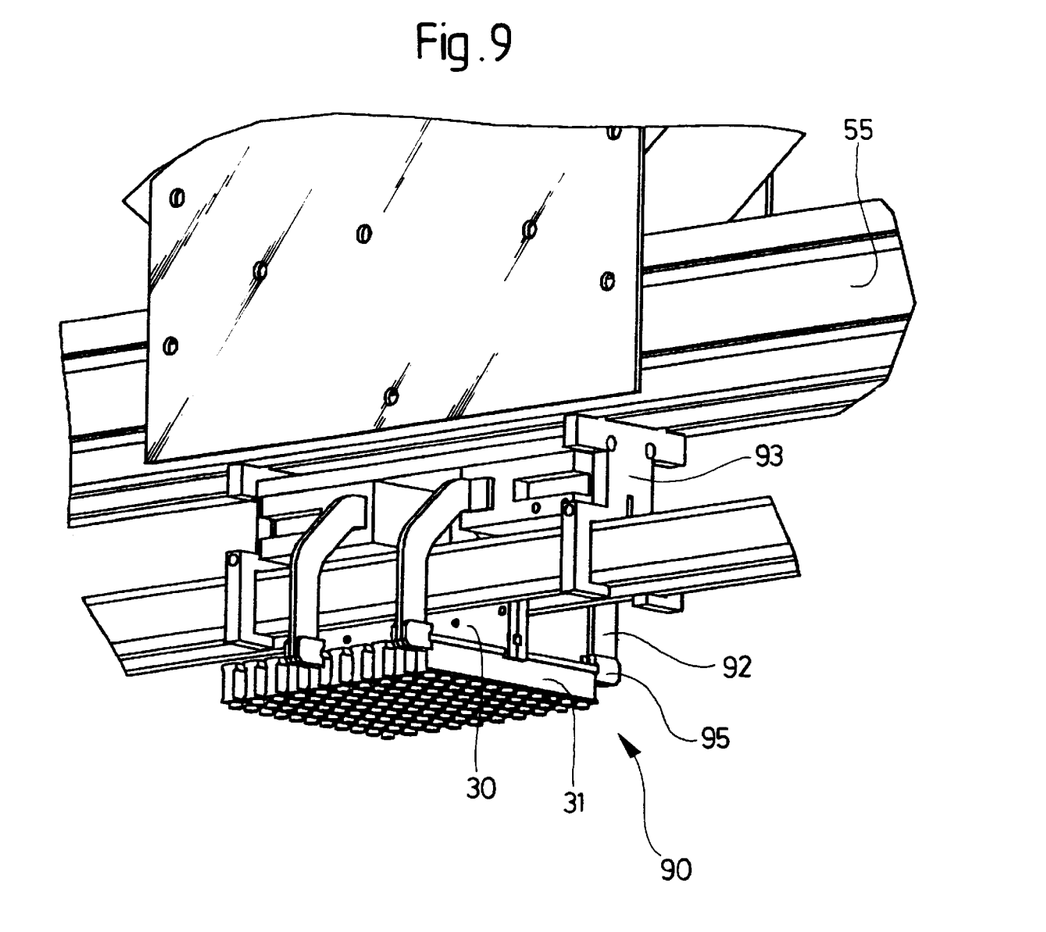
FIG. 9 shows an embodiment of the means for immobilising the subsidiary supports.

With reference to FIGS. 5 and 8, tool magazine 21 also includes immobilising means 90. Immobilising means 90 are essentially formed of a clamp 92 fixed to a beam of base chassis 51, typically lower cross beam 55 in the preferred embodiment, via immobilising elements 93. Clamp 92 is formed by two branches whose ends are provided with gripping elements 95, and between which link chain 30 passes. Thus, in the manner of a jaw, clamp 92 can clamp the ends of a bar 31, gripping elements 95 being suited to the geometry of said ends. This has the effect of removing any degree of freedom of said bar 31, as is shown in FIG. 9. The preferred embodiment shown has two clamps 92 of the aforementioned type, however a single clamp is sufficient for the assembly to operate properly.

The operation of a machine-tool of the type shown in FIG. 3 is as follows.

Since the structure of machine-tool 20 is close to a conventional structure, it goes without saying that its operation is relatively close to the operation of a conventional machine-tool, such operation being assumed to be known to the man skilled in the art.

Thus, the various tool transfers are conventionally performed, in particular during loading of a tool 12 from a bar 31 of the chain or from a machining station 7 in which the tool has to be replaced.

However, the operation of the machine-tool of the type shown in FIG. 3 includes different tool loading and bar renewing sequences from conventional sequences.

Programming means 23 virtually divide the link chain into several sequenced sub-assemblies, each sub-assembly including as many bars 31 as there are machining stations 7 in the machine-tool. Thus, each of bars 31 of each sequenced sub-assembly is allocated to a single machining station 7. By way of example, if the juxtaposed bars in the chain are numbered consecutively, for a machine-tool with six machining stations, the order of allocation of the machining stations is : 1 6 5 4 3 2. For a machine-tool with four machining stations each comprising two spindles, the order of allocation of the machining stations is : 1 5 8 4 7 3 6 2. Programming means 23 control the movement of the link chain, and identify the bar 31 of a sequenced sub-assembly, so that said bar 31 is virtually associated with the machining station 7 requiring a change of tool. The link chain is then driven, so as to bring said bar 31 above the immobilising clamp. The two branches 92 of said immobilising clamp then immobilise said bar.

In the embodiment described, the occupation of bar 31 by tools 12 is such that an empty site is provided for accommodating a used tool. Otherwise, the chain is driven again, so as to provide a new bar allocated to the same machining station and containing at least one new tool.

Changing of bars 31 occurs via operator interface 22, so that machine-tool 20 continues to perform machining operations during unloading/loading of subsidiary supports 31 into tool magazine 21, and so that the operator does not intervene directly inside the machine-tool.

A jack (not shown) allows the bar 31 concerned to be ejected (typically a bar provided solely with used tools) outside the machine-tool, as represented by the arrow designated E in FIG. 5. Moreover, the operator can introduce a bar 31 into an empty site on a link of the link chain, as is represented by the arrow designated I in FIG. 5. This bar 31 accommodated by said link 30 is held in intimate contact with link 30 by means 81, 82 for positioning link 30, as is shown in FIG. 8.

Improvements may be made to this operation, via modifications to the structure of the machine-tool of the type shown in FIG. 2.

A first improvement to the machine-tool according to the present invention consists in replacing the subsidiary supports automatically (typically the introduction of subsidiary supports containing new tools and the ejection of subsidiary supports containing used tools), for example by connecting the replacement means to a programmable control unit connected to the unloading/loading means and to motor means.

A second improvement to the machine-tool according to the present invention consists in using several immobilising clamps simultaneously in conjunction with as many changers, these changers constituting one of the tool transfer devices, which has the effect of reducing the used tool replacement cycle time, by replacing the tool in a minimum amount of time and with a minimum of movement.

It goes without saying for the man skilled in the art that the detailed description hereinbefore can undergo various modifications without departing from the scope of the present invention. For example, as an alternative, the site and the shape of the chain inside the frame of the machine-tool can be modified. The shape and the capacity of the links and bars can also be modified.

What is claimed is:

1. A machine-tool (20) intended to perform machining operations, in particular on printed circuit boards, including:
   a frame (1) having at least one end;
   a workpiece carrier (4) attached to said frame (1);
   at least one machining station (7) able to accommodate selectively a tool (12) for performing the machining operations in a working area;
   guiding means for assuring a relative movement between the machining station(s) and the workpiece carrier,
   at least one tool magazine (21) for storing a plurality of tools (12);
   a tool transfer device (18) for accommodating a tool (12); and
   control means (23) via whose action the tool magazine (21) is driven,
wherein the tool magazine (21) comprises a plurality of movably interconnected main supports (30) arranged to form a closed circuit, wherein each main support (30) is arranged to accommodate and hold a plurality of subsidiary supports (31), and wherein each subsidiary support (31) is arranged to carry at least two tools (12).

2. A machine-tool (20) according to claim 1, further including an operator interface (22) at one end of the frame (1), and including unloading/loading means (41, 42) situated in the vicinity of a part of the tool magazine (21), for automatically or manually unloading and loading at least one subsidiary support (31), so that the machine-tool (20) continues to perform machining operations during unloading/loading of the subsidiary supports (31) in the tool magazine (21).

3. A machine-tool (20) according to claim 2, wherein the unloading/loading means (41, 42) include means (42) for ejecting a subsidiary support (31) outside the machine-tool (20) for extracting a subsidiary support (31) from a main support (30), and means (41) for introducing a subsidiary support (31) onto a main support (30) from outside the machine-tool (20).

4. A machine-tool (20) according to claim 3, wherein the introducing means (41) include at least one slide block (43) which slides in an oblong groove (44) which is arranged in a wall of the frame (1) and is capable of being manually actuated, the slide block (43) being fitted with an actuating rod (45) for introducing a subsidiary support (31), and wherein the ejection means (42) include at least one jack type device.

5. A machine-tool according to claim 4, wherein the introducing means (41) further include subsidiary support guiding means formed by a groove (47) having a profiled cross-section and extending parallel to the oblong groove (44).

6. A machine-tool (20) according to claim 1, wherein the tool magazine (21) is formed of a base chassis (51) for supporting the interconnected main supports (30), the base chassis (51) being fitted with main support guiding means (52) for guiding the main supports (30) all the way along the base chassis (51).

7. A machine-tool (20) according to claim 6, wherein the base chassis (51) is formed by a rigid frame having four beams (55, 56) consisting of two parallel transverse beams (55) and two parallel vertical beams (56).

8. A machine-tool according to claim 7, wherein the main support guiding means (52) are formed by a groove having a profiled cross-section arranged all the way along the beams (55, 56) forming the frame of the base chassis.

9. A machine-tool according to claim 8, wherein it further includes two columns (58) attached to the frame (1) and connected to two vertical beams (56) of the base chassis, so that the base chassis (51) and the columns (58) extend in a plane situated in front of the machining station(s) (7).

10. A machine-tool according to claim 9, wherein it further includes a hood (3) able to move with respect to the frame (1) between two respective closed and open positions, wherein the tool magazine (21) is able to move in translation along the columns (58) between two respective positions, a first position in which the tool magazine (21) is disposed in the vicinity of the working area and a second position in which the tool magazine (21) is not in the vicinity of the working area, and wherein the hood (3) is attached to the tool magazine (21), so that in passing from its closed position to its open position the hood (3) drives in its travel the tool magazine (21) from its first position to its second position, and allows access to the working area by an operator.

11. A machine-tool according to claim 10, wherein it further includes two connecting elements and two jacks (60), wherein each connecting element is formed of a sleeve (59) which slides on a column (58), and is attached to the vertical beam (56) corresponding to said column (58), and wherein each jack (60) connects a sleeve (59) to said column (58), so that the jacks (60) combined with the sleeves (59) drive the base chassis (51) from the first position to the second position.

12. A machine-tool (20) according to claim 11, wherein the first and second ends of each jack (60) are fixed respectively to the corresponding column (58) and the corresponding sleeve (59).

13. A machine-tool (20) according to claim 1, wherein the tool magazine comprises by a link chain, in that each link constitutes a main support (30), and wherein the chain can be driven by motor means (100) in response to the control means (23).

14. A machine-tool (20) according to claim 8, wherein each link (30) is formed by two identical plates (75, 76), and is hinged to each of its neighbouring links by a pin (70) which passes through the thickness of the link, wherein the pin length is greater than the link thickness, and wherein the pin (70) co-operates with the groove of the beams (55, 56) of the base chassis (51) to guide the link (30).

15. A machine-tool (20) according to claim 14, wherein each link (30) is provided with slide ways (71) in each of which a subsidiary support (31) can be engaged by sliding.

16. A machine-tool according to claim 15, wherein the slide ways (71) are identical, and have a common sliding direction which is perpendicular to the plane containing the base chassis (51).

17. A machine-tool (20) according to claim 16, wherein each subsidiary support (31) is formed by a bar having a determined profile, wherein a first face (72) of the bar is provided with at least two independent cylindrical conduits (73) having parallel axes to each other, and wherein each conduit (73) of the bar can accommodate a tool (12).

18. A machine-tool (20) according to claim 17, wherein the face opposite the first face (72) of the bar includes positioning recesses (80).

19. A machine-tool (20) according to claim 17, wherein the conduits (73) are through conduits, so as to form the positioning recesses (80) when said conduits (73) open out onto the face opposite the first face (72) of the bar.

20. A machine-tool according to claim 18, wherein the link (30) includes means (81, 82) for positioning the bars engaged on the link.

21. A machine-tool (20) according to claim 20, wherein the positioning means (81, 82) include a strip (82) made of resilient material extending into a first conduit (83) formed in the link (30), and a plurality of balls (82) each disposed in second conduits (84) opening out, on the one hand, into the base of each slide way (71) and, on the other hand, into the first conduit (83), the strip (81) exerting a resilient return force onto each ball (82), so that each ball (82) thus projects into the base of the corresponding slide way (71), each ball (82) being intended to co-operate with one of the positioning recesses (80) of a bar engaged in the corresponding slide way (71) to hold said bar in a determined position.

22. A machine-tool (20) according to claim 1, further including means (90) for immobilising a subsidiary support (31) with respect to the transfer device (18).

23. A machine-tool according to claim 22, wherein the immobilising means (90) are formed by at least one clamp (92) fixed to one of the beams (55, 56) of the base chassis (51) by immobilising elements (93), the clamp (92) being formed by two branches whose ends are provided with gripping elements (95) suited to the shape of the ends of a bar, and between which the link chain (30) passes so that the clamp (92) can grip the ends of a bar in the manner of a jaw.

24. A tool magazine (21) able to accommodate a plurality of tools (12), and arranged to be fitted to a machine-tool (20), wherein the tool magazine is formed as a closed circuit of a plurality of movably interconnected main supports (30), wherein each main support (30) is capable of accommodating and holding a plurality of subsidiary supports (31), and wherein each subsidiary support (31) is arranged to carry at least two tools (12).

* * * * *